US008251546B2

(12) United States Patent
Chen et al.

(10) Patent No.: US 8,251,546 B2

(45) Date of Patent: Aug. 28, 2012

(54) LED LAMP WITH A PLURALITY OF REFLECTORS

(75) Inventors: Chin-Chung Chen, Taipei Hsien (TW); Shi-Yu Song, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 400 days.

(21) Appl. No.: 12/686,322

(22) Filed: Jan. 12, 2010

(65) Prior Publication Data

US 2011/0128733 A1 Jun. 2, 2011

(30) Foreign Application Priority Data

Nov. 27, 2009 (CN) .......................... 2009 1 0310571

(51) Int. Cl.
*F21V 7/09* (2006.01)
*H01L 33/00* (2010.01)

(52) U.S. Cl. ......... 362/297; 362/243; 362/247; 313/114

(58) Field of Classification Search .................. 313/498, 313/114; 362/241, 243, 247–248, 217.02, 362/800, 217.05, 296.01, 297
See application file for complete search history.

(56) References Cited

U.S. PATENT DOCUMENTS

| | | | | |
|---|---|---|---|---|
| 6,758,582 | B1 * | 7/2004 | Hsiao et al. | 362/302 |
| 7,036,967 | B2 * | 5/2006 | Morishita et al. | 362/517 |
| 7,416,322 | B2 * | 8/2008 | Tanaka et al. | 362/514 |
| 2005/0185419 | A1 * | 8/2005 | Holman et al. | 362/561 |
| 2007/0019412 | A1 * | 1/2007 | Han et al. | 362/247 |
| 2007/0297179 | A1 * | 12/2007 | Leung et al. | 362/296 |
| 2008/0239751 | A1 * | 10/2008 | Chang | 362/612 |

* cited by examiner

*Primary Examiner* — Karabi Guharay

(74) *Attorney, Agent, or Firm* — Altis Law Group, Inc.

(57) ABSTRACT

An LED module includes a housing, a plurality of LED modules, a plurality of first and second reflectors, a heat sink attached to the housing and an envelope engaged with the housing and covering the LED modules, the first and second reflectors. The housing includes a base and four sidewalls extending upwardly from edges of the base. The LED modules are mounted on the base. The first reflectors are accommodated in the housing and each cover a corresponding LED module. The second reflectors are mounted on the base and each located at a lateral side of the corresponding LED module.

13 Claims, 3 Drawing Sheets

LED LAMP WITH A PLURALITY OF REFLECTORS

BACKGROUND

1. Technical Field

The present disclosure relates generally to a light fixture, and more particularly to a light fixture for use with solid state light emitters, e.g., light emitting diodes (LEDs).

2. Description of Related Art

LED lamp, a solid-state lighting, utilizes LEDs as a source of illumination, providing advantages such as resistance to shock and nearly limitless lifetime under specific conditions. Thus, LED lamps present a cost-effective yet high quality replacement for incandescent and fluorescent lamps.

However, the light rays emitted by a conventional LED lamp without optical treatment are very glaring and are not suitable for illumination.

What is need therefore is an LED lamp which can overcome the above limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
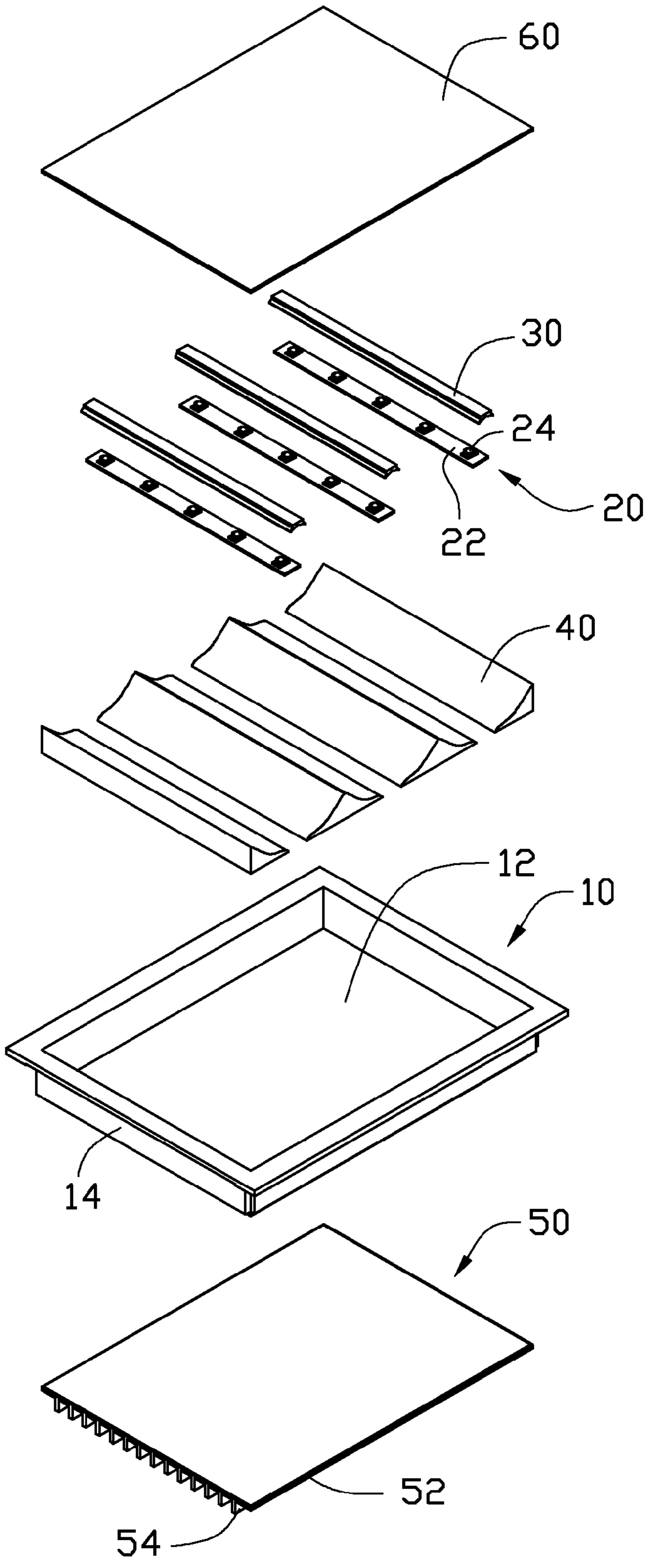
FIG. 1 is an isometric, exploded view of an LED lamp in accordance with an embodiment of the present disclosure.
Figure 2:
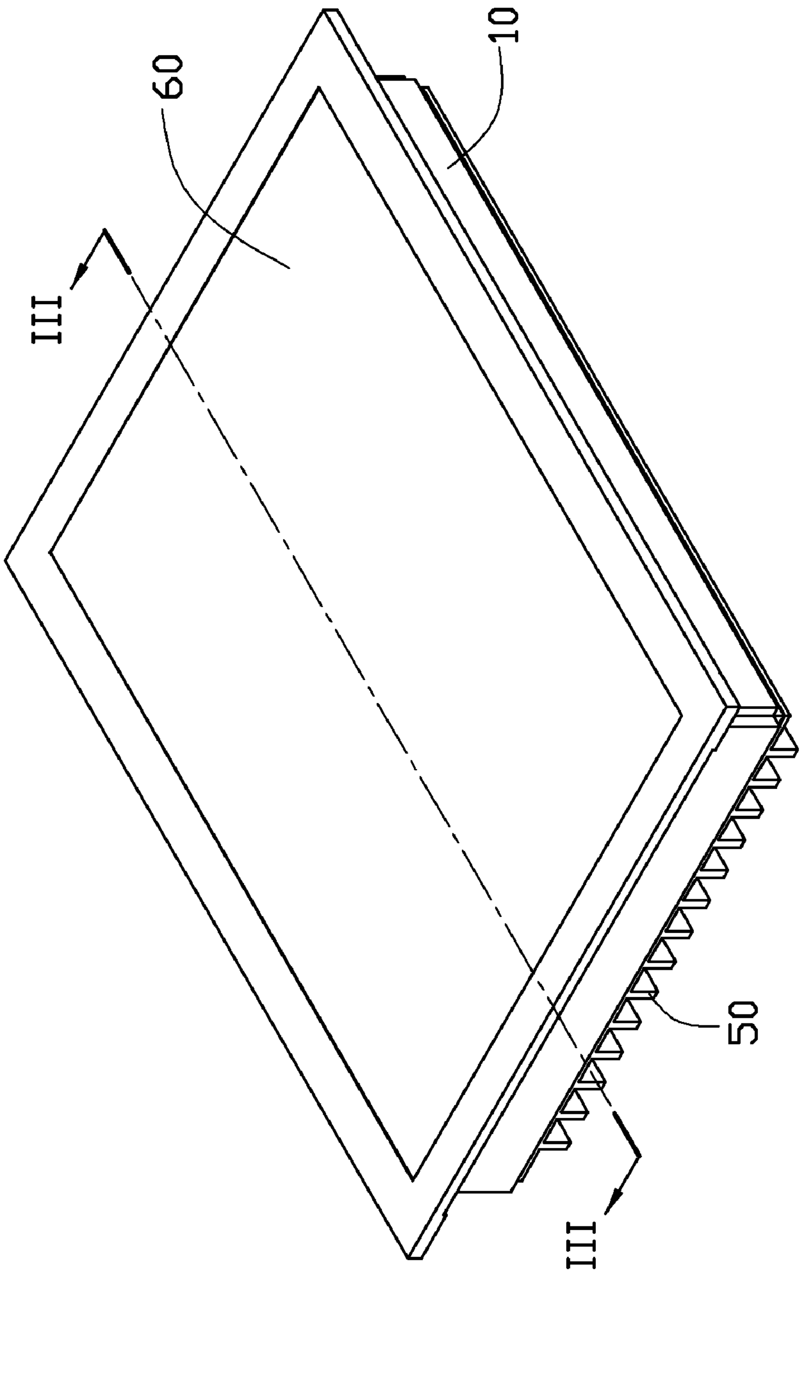
FIG. 2 is an isometric, assembled view of the LED lamp in FIG. 1.

An LED lamp of the present disclosure can be applied in an office, a hall or other indoor rooms for illumination or decoration. As shown in FIGS. 1-2, the LED lamp in accordance with an embodiment of the present disclosure comprises a housing 10, a plurality of LED modules 20 received in the housing 10, a plurality of first reflectors 30 and a plurality of second reflectors 40 accommodated in the housing 10 for reflecting light generated by the LED modules 20 out of the housing 10, a heat sink 50 attached to a bottom of the housing 10, and an envelope 60 covering the housing 10.

Figure 3:
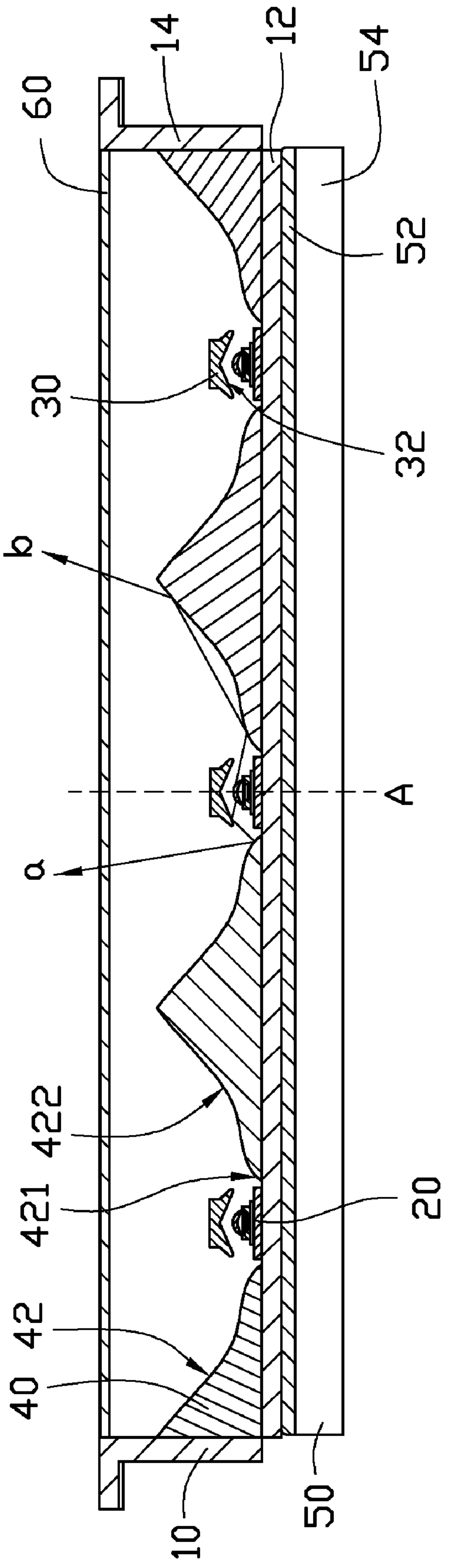
FIG. 3 is a cross-sectional view of the LED lamp in FIG. 2, taken along line III-III thereof.

Also referring to FIG. 3, the housing 10 is substantially a rectangular box with a top thereof opened. In detail, the housing 10 comprises a bottom plate 12 and four sidewalls 14 extending upwardly from edges of the bottom plate 12. The housing 10 is made of material with a good heat conductivity, for example, aluminum, for dissipating heat from the LED modules 20 received in the housing 10.

Each LED module 20 comprises an elongated printed circuit board 22 and a plurality of LEDs 24 arranged on the printed circuit board 22 in a line. The LED modules 20 are mounted on the bottom plate 12 in parallel and spaced from each other. The LED 24 has a light axis A. The light axes A of the LEDs 24 of each LED module 20 are coplanar.

The heat sink 50 comprises a base 52 and a plurality of parallel fins 54 extending downwardly from the base 52. The base 52 is attached to a bottom of the bottom plate 12 of the housing 10. The heat sink 50 can absorb heat from the housing 10 and dissipate the heat into atmosphere.

The number of the first reflectors 30 is equal to that of the LED modules 20. Each first reflector 30 covers each LED module 20 and a desired distance is kept therebetween. Each first reflector 30 has a strip shape and has two ends thereof fixed onto two opposite sidewalls 14. A bottom surface of the first reflector 30 faced to the LED module 20 is concaved to form a first reflecting surface 32. The first reflecting surface 32 comprises two downwardly and symmetrically inclined surfaces. The light axis A of the LED 24 passes through an intersecting line of the two inclined surfaces.

The second reflectors 40 are mounted on the bottom plate 12 and each are located beside a long side of a corresponding LED module 20. Each LED module 20 is located between two second reflectors 40 which are mirror-imaged with each other in respect to the light axis A of the each LED module 20, as viewed from FIG. 3. Each second reflector 40 has a second reflecting surface 42 on a top thereof. The second reflecting surface 42 is a curved surface. The second reflecting surface 42 comprises a convex portion 421 adjacent to the LED module 20 and a concaved portion 422 continuous with the convex portion 421. The concaved portion 422 is higher than the convex portion 421 and away from the LED module 20. In the preferred embodiment, two second reflectors 40 mounted between two adjacent LED modules 20 are formed as an integral one which has a shape substantially of a mountain peak.

As shown in FIG. 3, each LED module 20 has a first reflector 30 covering the each LED module 20, and two second reflectors 40 respectively located at two lateral sides thereof. In use of the LED lamp, a part of the light generated by the LED modules 20, e.g., the light beam shown as line a in FIG. 3, is reflected by the first reflectors 30 firstly, and then reflected by the second reflectors 40 and out of the housing 10. Another part of the light, e.g., the light beam shown as line b in FIG. 3, is directed to the second reflectors 40 and reflected out of the housing 10. Preferably, the first and second reflecting surfaces 32, 42 are diffusively reflection surfaces which are formed by reflective white coating, and understandably the optical paths of the light rays shown by the lines a and b are just exemplary and schematic. After reflected by the first and second reflecting surfaces 32, 42, the light out of the housing 10 is evenly for illumination. Since the LED modules 20 are covered by the first reflectors 30, and are not directly visible by users, glare is thereby eliminated; thus, the light of the present disclosure is more comfortable for users.

The envelope 60 covering the housing 10 can protect the LED modules 20 in the housing 10, as well as further diffuse the light after reflected by the first and second reflectors 30, 40.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED lamp comprising:

a housing;

a plurality of LED modules received in the housing;

a plurality of first reflectors accommodated in the housing and each first reflector covering a corresponding LED module; and a plurality of second reflectors mounted in the housing and located at lateral sides of the LED modules;

wherein at least a part of light generated by the LED modules is first reflected by one of the first reflectors and then by one of the second reflectors neighboring the one of the first reflectors to radiate out of the housing of the LED lamp;

wherein the housing comprises a base and four sidewalls extending upwardly from edges of the base, the LED modules and the second reflectors are mounted on the base, and the first reflectors are fixed on the sidewalls; and wherein the second reflectors each comprise a second reflecting surface at a top thereof, and the second reflecting surface comprises a convex portion adjacent to the LED module and a concaved portion continuous with the convex portion.

2. The LED lamp of claim 1, wherein the each first reflector is located above and spaces a distance from the corresponding LED module.

3. The LED lamp of claim 1 further comprising a heat sink attached to the housing and in thermal connection with the LED modules.

4. The LED lamp of claim 1 further comprising an envelope engaged with the housing and covering the LED modules and the first and second reflectors.

5. The LED lamp of claim 1, wherein bottom surfaces of the first reflectors facing to the LED modules are concaved to be first reflecting surfaces for reflecting the light generated by the LED modules.

6. The LED lamp of claim 5, wherein the LED modules each comprise a printed circuit board and a plurality of LEDs mounted thereon in a line, the LEDs each have a light axis, and the first reflectors each have a strip shape and are symmetrical relative to the light axis.

7. The LED lamp of claim 6, wherein the first reflecting surfaces each comprise two inclined surfaces and the light axis passes through an intersecting line of the two inclined surfaces.

8. The LED lamp of claim 1, wherein the concaved portion is higher than the convex portion and away from the LED module.

9. The LED lamp of claim 1, wherein each of the second reflectors mounted between two adjacent LED modules has a shape of a mountain peak.

10. An LED lamp comprising:

a housing comprising a base and four sidewalls extending upwardly from edges of the base;

a plurality of LED modules mounted on the base and spaced from each other;

a plurality of first reflectors accommodated in the housing and each first reflector covering a corresponding LED module and spaced from the corresponding LED module;

a plurality of second reflectors mounted on the base and each located at a lateral side of the corresponding LED module;

a heat sink attached to a bottom of the base of the housing; and an envelope engaged with the housing and covering the LED modules and the first and second reflectors;

wherein at least a part of light generated by the LED modules is first reflected by one of the first reflectors and then by one of the second reflectors neighboring the one of the first reflectors to radiate out of the housing of the LED lamp via the envelope; and wherein the second reflectors each comprise a curved second reflecting surface at a top thereof, the second reflecting surface comprising a convex portion adjacent to the LED module and a concaved portion continuous with the convex portion, the concaved portion being higher than the convex portion.

11. The LED lamp of claim 10, wherein the LED modules each comprise a printed circuit board and a plurality of LEDs mounted thereon in a line, the LEDs each have a light axis, and the first reflectors each have a strip shape and are symmetrical relative to the light axis.

12. The LED lamp of claim 11, wherein bottom surfaces of the first reflectors facing to the LED modules are concaved to be first reflecting surfaces for reflecting the light generated by the LED modules, the first reflecting surfaces each comprise two inclined surfaces and the light axis passes through an intersecting line of the two inclined surfaces.

13. The LED lamp of claim 10, wherein each of the second reflectors located between two adjacent LED modules has a shape of a mountain peak.

* * * * *